United States Patent [19]
Hori

[11] Patent Number: 5,459,426
[45] Date of Patent: Oct. 17, 1995

[54] OUTPUT LEVEL CONTROL CIRCUIT FOR SETTING TRANSMISSION OUTPUT TO DESIRED LEVEL

[75] Inventor: Tsuguo Hori, Tokyo, Japan

[73] Assignee: NEC Corporation, Tokyo, Japan

[21] Appl. No.: 312,903

[22] Filed: Sep. 30, 1994

[30] Foreign Application Priority Data

Sep. 30, 1993 [JP] Japan .................................. 5-244056

[51] Int. Cl.$^6$ ...................................................... H03L 5/00
[52] U.S. Cl. ............................ 327/332; 327/316; 327/73; 327/538; 455/126
[58] Field of Search ................................ 327/54, 67, 73, 327/87, 316, 323, 332, 362, 535, 538, 540; 345/116, 126

[56] References Cited

U.S. PATENT DOCUMENTS

| | | | |
|---|---|---|---|
| 5,214,393 | 5/1993 | Aihara | 330/279 |
| 5,335,369 | 8/1994 | Aisaka | 455/116 |
| 5,337,006 | 8/1994 | Miyazaki | 455/126 |
| 5,381,115 | 1/1995 | Timmons et al. | 455/126 |

FOREIGN PATENT DOCUMENTS

| | | |
|---|---|---|
| 61-12132 | 1/1986 | Japan . |
| 62-76933 | 4/1987 | Japan . |
| 2-241135 | 9/1990 | Japan . |
| 4-100426 | 4/1992 | Japan . |
| 4-100427 | 4/1992 | Japan . |
| 4-100428 | 4/1992 | Japan . |

*Primary Examiner*—John S. Heyman
*Assistant Examiner*—Jung Ho Kim
*Attorney, Agent, or Firm*—Foley & Lardner

[57] ABSTRACT

The present invention provides an output level control circuit for a transmitter of an automobile telephone system which can output a transmission output signal of an output level indicated by a level setting signal with a high degree of accuracy. First and second level control circuits function for a low-level side and a high-level side, respectively, of the detection output of a detection circuit and perform weighting such that the outputs vary with linearity relative to the output signal of the amplifier. A control signal generation circuit causes a selection circuit to select a first or second error signal of a first or second comparison circuit, respectively. The first and second comparison circuits receive the output of the first or second level control circuit, respectively, and these control circuits process the detection output corresponding to the output level of the output signal of the amplifier indicated by a level setting signal. An amplifier control circuit supplies the amplifier with a level control voltage in response to the first or second error signal output selected by the selection circuit and controls the amplifier so that the amplifier may output an output signal of the output level indicated by the level setting signal.

5 Claims, 6 Drawing Sheets

OUTPUT LEVEL CONTROL CIRCUIT FOR SETTING TRANSMISSION OUTPUT TO DESIRED LEVEL

BACKGROUND OF THE INVENTION

1. Field of the Invention

This invention relates to an output level control circuit for controlling the output level of an amplifier or a like circuit, and more particularly to an output level control circuit which varies the output level of a transmitter of an automobile telephone system or a like system over a wide dynamic range.

2. Description of the Related Art

FIG. 1 is a block diagram showing an example of a conventional output level control circuit of the type mentioned. The output level control circuit shown includes amplifier 21, coupler 22, detection circuit 23, level control circuit 24, comparison circuit 25, amplifier control circuit 29 and control signal generation circuit 30. Amplifier 21 amplifies a signal SS inputted thereto from input terminal 31 and outputs amplification output SQ through output terminal 32. Coupler 22 outputs coupler output SR which increases in proportion to the amplification output level in accordance with a fixed coupling amount relative to amplification output SQ. Coupler output SR of coupler 22 is detected by detection circuit 23, and detection output SD of detection circuit 23 is weighted by level control circuit 24 and outputted as weighted detection output WSD.

Control signal generation circuit 30 receives setting signal S10 for the level of output SQ from a control section (not shown) through control terminal 33 and generates and supplies reference level S11 in accordance with setting signal S10 to comparison circuit 25. Comparison circuit 25 compares output WSD of level control circuit 24 and reference level S11 to generate error signal G11 and supplies error signal G11 to amplifier control circuit 29. Amplifier control circuit 29 generates control voltage G12 in accordance with error signal G11 in order to adjust the output level of amplifier 21 to the level indicated by setting signal S10. A closed loop is formed to control the output level of amplification output SQ in this manner.

In an automobile telephone system or a like system, the transmission output to be sent from a base station must be continuously varied to an optimum level as an automobile telephone moves. The level of the transmission output must be varied over a wide range. In this instance, the conventional output level control circuit is disadvantageous in that it is not easy to obtain the output of the amplifier with a high degree of accuracy at the upper limit or the lower limit of the level of output SQ because of the non-linearity of the characteristics of the detection circuit.

To describe this disadvantage in more detail, detection output SD of detection circuit 23 does not increase in proportion to coupler output SR from coupler 22, and the characteristic between outputs SD and SR is consequently indicated by a non-linear characteristic curve as shown in FIG. 2. Particularly within the range (between RL and RM in FIG. 2) of the level of output SR below boundary level RM, that is, on the low-level side, the characteristic curve becomes nearly horizontal. Since the characteristic curve of FIG. 2 can generally be represented as two linear lines shown in FIG. 3, the following description proceeds with reference to FIG. 3 for a simplified description.

In order to cause detection output SD (the line SD is composed of lines $SD_1$ and $SD_2$ in FIG. 3) to increase in proportion to output SR as far as possible within the overall range (RL to RH) of output SR in the characteristic indicated in FIG. 3, level control circuit 24 must, for example, raise the amplification factor (gain) on the low-level side of output SR. However, level control circuit 24 of the conventional output level control circuit of FIG. 1 is defective in this regard since it applies the same weighting to output SR over the entire range of the output level. For example, if the inclination of the linear line ($SD_1$) on the low-level side of output SR is increased with the intention of bringing the low-level side of output SR close to its ideal condition by increasing the amplification factor, the inclination of the high-level side (RM to RH) of output SR above the boundary level also increases, thereby distancing the output $SD_2$ on the high-level side of output SR from its ideal condition. In contrast, if the inclination of the linear line on the high-level side of output SR is decreased with the intention of bringing the high-level side close to its ideal condition, the inclination of the linear line on the low-level side decreases, thereby distancing the output $SD_1$ on the low-level side of output SR from its ideal condition.

Accordingly, it is difficult to allow output SD to approach its ideal condition within the overall range of output SR, and the control of output SD corresponding to output SR remains a compromised weighting control. Meanwhile, according to another conventional method, it seems possible to provide level control circuit 34 with an input-output table in the form of ROM or a like element so as to ensure linearity. However, this method requires an expensive device such as ROM and is therefore not desirable for reasons of cost.

SUMMARY OF THE INVENTION

It is an object of the present invention to provide an output level control circuit wherein the non-linearity between output SR, which increases in proportion to output SQ, and output SD can be reduced by simple means.

In order to attain the object described above, according to the present invention, there is provided an output level control circuit for a transmitter which inputs an input signal and a level setting signal which indicates a transmission output level, amplifies the input signal to a transmission output level indicated by the level setting signal and outputs the signal of the transmission output level as a transmission output signal, the output level control circuit comprising: an amplifier for amplifying the input signal while varying the output level of the output signal in response to a level control voltage; a coupler for extracting a coupler output from the output signal of the amplifier in accordance with a fixed coupling amount; a detection circuit for detecting the coupler output and outputting a detection output; a first level control circuit for weighting the level of the detection output of the detection circuit so that the detection output may keep, when the detection output is at a predetermined boundary level or on the low-level side below the boundary level, a linearity wherein the detection output increases in proportion to the variation of the level of the output signal of the amplifier; a second level control circuit for weighting the level of the detection output of the detection circuit so that when the detection output is on the high-level side above the boundary level, the detection output may keep a linearity wherein the detection output increases in proportion to the variation of the level of the output signal of the amplifier; a first comparison circuit for comparing the output level of the first level control circuit with a first reference level to generate a first error signal; a second comparison circuit for comparing the output level of the second level control circuit with a second reference level to generate a second error signal; a selection circuit for selectively outputting the first error signal of the first comparison circuit or the second error signal of the second comparison circuit in accordance with a selection signal; a control signal generation circuit for supplying the first and second reference levels to the first and second comparison circuits, respectively, so that the transmission output level may coincide with the indication of the level setting signal, outputting the selection signal indicating that the first error signal of the first comparison circuit should be selected when the transmission output level indicated by the level setting signal corresponds to the low-level side with respect to the boundary level, but outputting the selection signal indicating that the second error signal of the second comparison circuit should be selected when the transmission output level corresponds to the high-level side with respect to the boundary level, and supplying the thus-outputted selection signal to the selection circuit; and an amplifier control circuit for supplying the level control voltage in response to the first or second error signal selected by the selection circuit to the amplifier.

Preferably, in carrying out weighting, the amplification factor of the first level control circuit is increased so as to approximate the amplification factor of the second level control circuit, and the output of the second level control circuit is provided with an offset so that the variation of the output of the second level control circuit has continuity with the variation of the output of the first level control circuit.

Preferably, in carrying out weighting, the amplification factor of the first level control circuit is increased so as to approximate a desired amplification factor while the amplification factor of the second level control circuit is decreased so as to approximate the desired amplification factor, and the output of the second level control circuit is provided with an offset so that the variation of the output of the second level control circuit has continuity with the variation of the output of the first level control circuit.

Preferably, the control signal generation circuit outputs the first reference level to the first comparison circuit when the transmission output level indicated by the level setting signal corresponds to the low-level side with respect to the boundary level, but outputs the second reference level to the second comparison circuit when the transmission output level indicated by the level setting signal corresponds to the high-level side with respect to the boundary level. Under certain circumstances, the first and second reference levels preferably have an equal level corresponding to the indication of the level setting signal and are outputted simultaneously to the first and second comparison circuits.

In this manner, the first and second level control circuits function for the low-level side and the high-level side, respectively, of the detection output of the detection circuit and perform weighting so that the outputs thereof may vary with a linearity relative to the output signal of the amplifier. The control signal generation circuit causes the selection circuit to select the error signal of the first comparison circuit or the second comparison circuit which receives the output of the first or second level control circuit, respectively. The first or second level control circuit processes the detection output corresponding to the output level of the output signal of the amplifier indicated by the level setting signal. The amplifier control circuit supplies the amplifier with a level control voltage in response to the first or second error signal output selected by the selection circuit and controls the amplifier so that the amplifier may output an output signal of the output level indicated by the level setting signal.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENT

Figure 4:
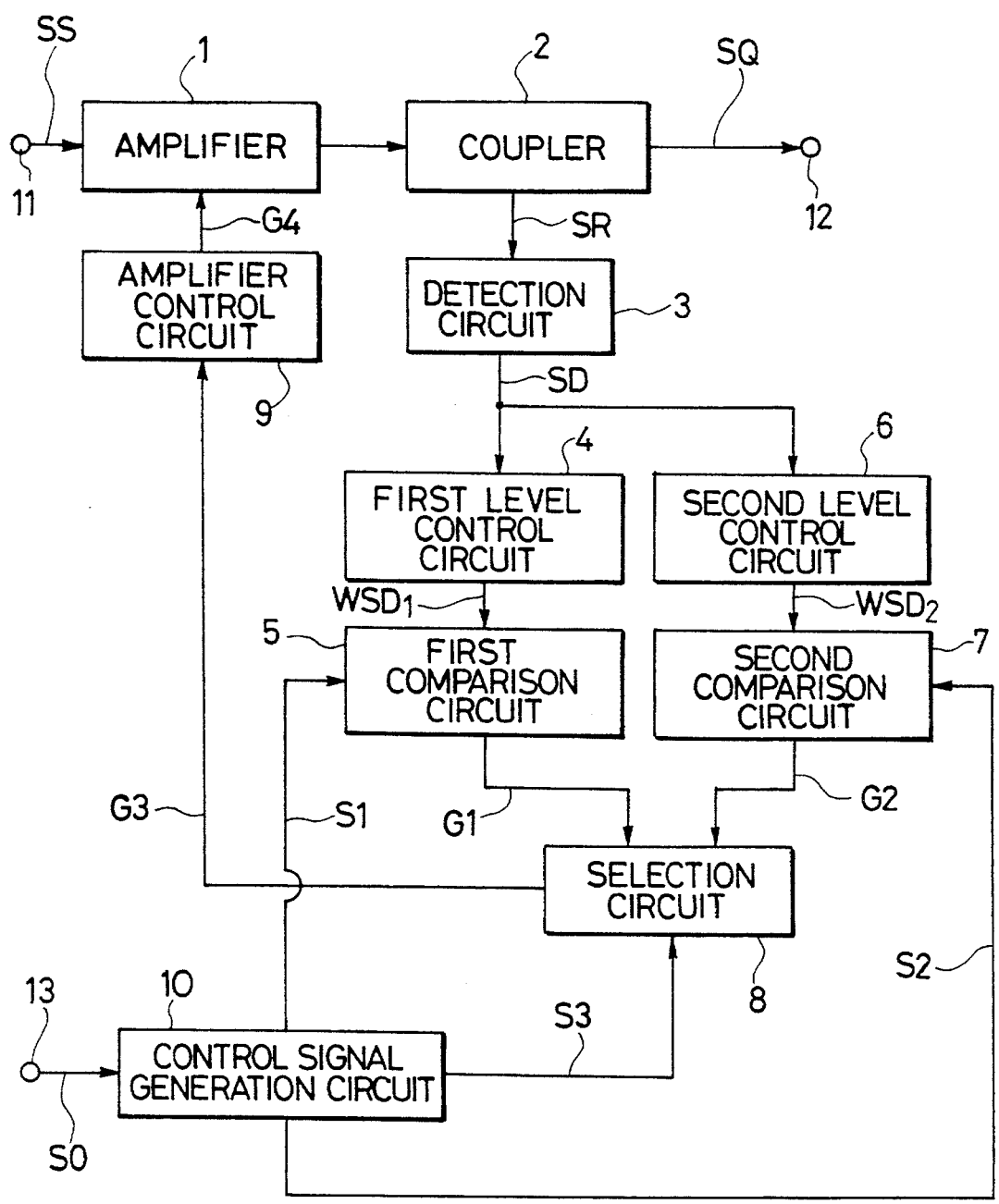
FIG. 4 is a block diagram showing an embodiment of an output level control circuit of the present invention.

An embodiment of the present invention is described below with reference to the drawings. The embodiment of FIG. 4 is an output level control circuit for a transmitter of an automobile telephone system and includes amplifier 1, coupler 2, detection circuit 3, first level and second level control circuits 4 and 6, first and second comparison circuits 5 and 7, selection circuit 8, amplifier control circuit 9 and control signal generation circuit 10.

Amplifier 1 amplifies an input signal from input terminal 11 and outputs an output signal SQ to coupler 2. Coupler 2 passes output signal SQ to terminal 12, and coupler 2 also outputs to detection circuit 3 a coupler output which is extracted from output signal SQ according to a fixed coupling amount (a ratio of output SR to output SQ), and coupler output SR therefore increases in proportion to the level of output signal SQ of amplifier 1. Coupler output SR is detected by detection circuit 3 (e.g. output SR is rectified by circuit 3). Detection output SD of detection circuit 3 is delivered to first level control circuit 4 and second level control circuit 6.

First level control circuit 4 functions for a range up to and including a predetermined boundary level (low-level side) of the range of the level of coupler output SR and weights the level of detection output SD so that the weighted detection output $WSDP_1$ may have an improved linearity which increases in proportion to the variation of the level of coupler output SR (or the output signal of amplifier 1). Second level control circuit 6 functions for the remaining range of the level of coupler output SR which is higher than the boundary level (high-level side) and weights the level of detection output SD so that the weighted detection output $WSD_2$ may have an improved linearity which increases in proportion to the variation of the level of coupler output SR (or output signal SQ of amplifier 1).

Control signal generation circuit 10 receives setting signal S0 (setting signal S0 indicates the level of output signal SQ of amplifier 1) from a control section (not shown) through control terminal 13 and generates and supplies first reference level S1 and second reference level S2 in accordance with setting signal S0 to first comparison circuit 5 and second comparison circuit 7, respectively. Further, control signal generation circuit 10 generates and supplies selection signal S3 to selection circuit 8 for selection of the output of first comparison circuit 5 or second comparison circuit 7. Selection signal S3 causes selection circuit 8 to select the output of first comparison circuit 5 when signal S0 indicates the low-level side of output signal SQ or to select the output of second comparison circuit 7 when signal S0 indicates the high-level side of output signal SQ.

First comparison circuit 5 compares the output of first level control circuit 4 and first reference level S1 with each other to generate first error signal G1 and supplies first error signal G1 to selection circuit 8. Second comparison circuit 7 compares the output of second level control circuit 6 and second reference level S2 with each other to generate second error signal G2 and supplies second error signal G2 to selection circuit 8.

Selection circuit 8 selects one of first error signal G1 and second error signal G2 in accordance with selection signal S3 from control signal generation circuit 10 and supplies the selected error signal as error signal G3 to amplifier control circuit 9. Amplifier control circuit 9 generates control voltage G4 in response to error signal G3 to control the output level of amplifier 1. By forming the above-described closed loop, the output level can be controlled over a wide dynamic range so that output signal SQ keeps the level designated by setting signal S0.

Since selection circuit 8 described above selects only one of first and second error signals G1 and G2 from the first and second comparison circuits in response to selection signal S3, first and second reference levels S1 and S2 may have an equal level corresponding to setting signal S0. Naturally, first and second reference levels S1 and S2 need not be outputted simultaneously, and only one of them may be outputted corresponding to setting signal S0.

Figure 1:
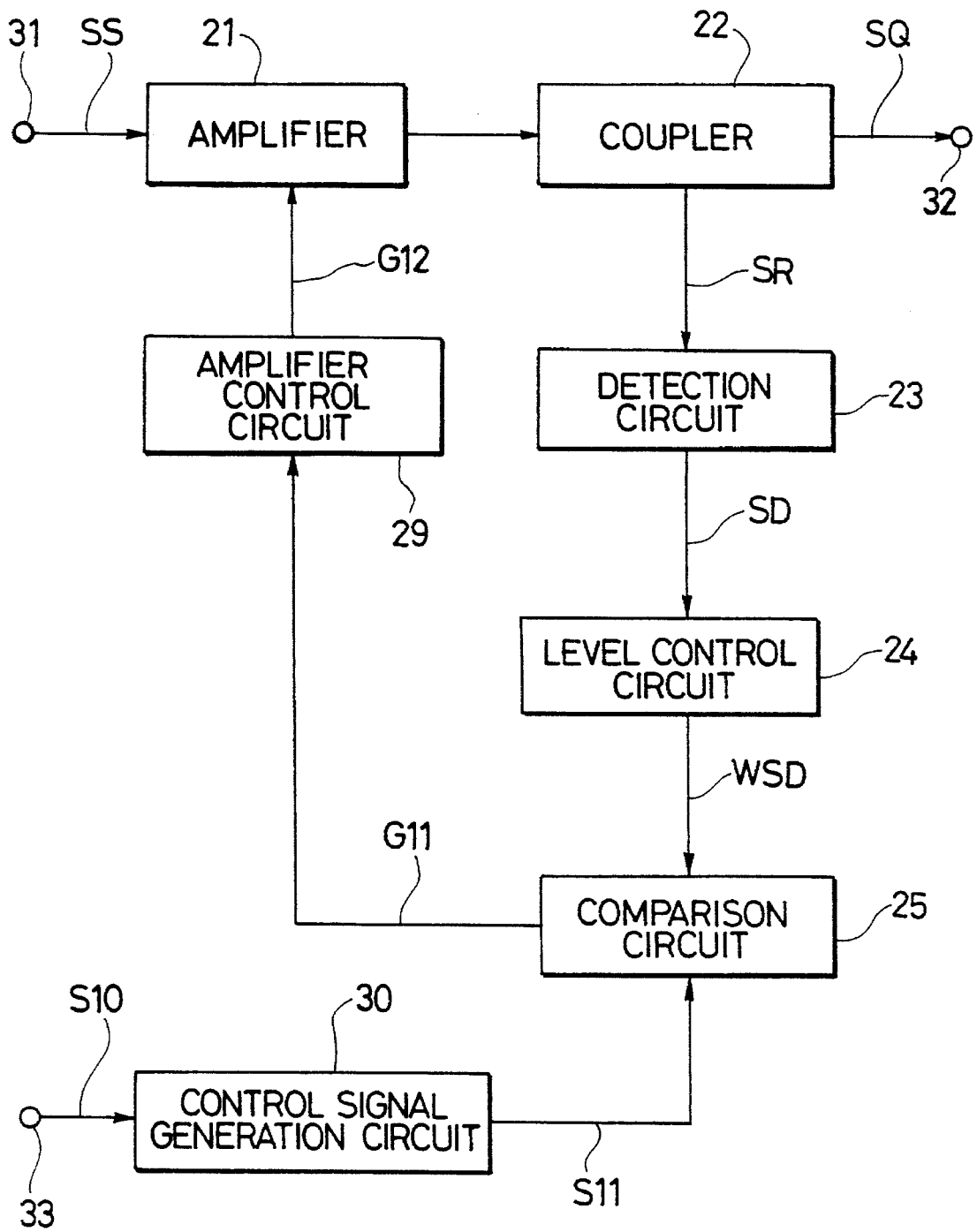
FIG. 1 is a block diagram showing an example of a conventional output level control circuit.

The embodiment described above is described in more detail below in comparison with the characteristic of the conventional example of FIG. 1 illustrated in FIG. 3.

Figure 2:
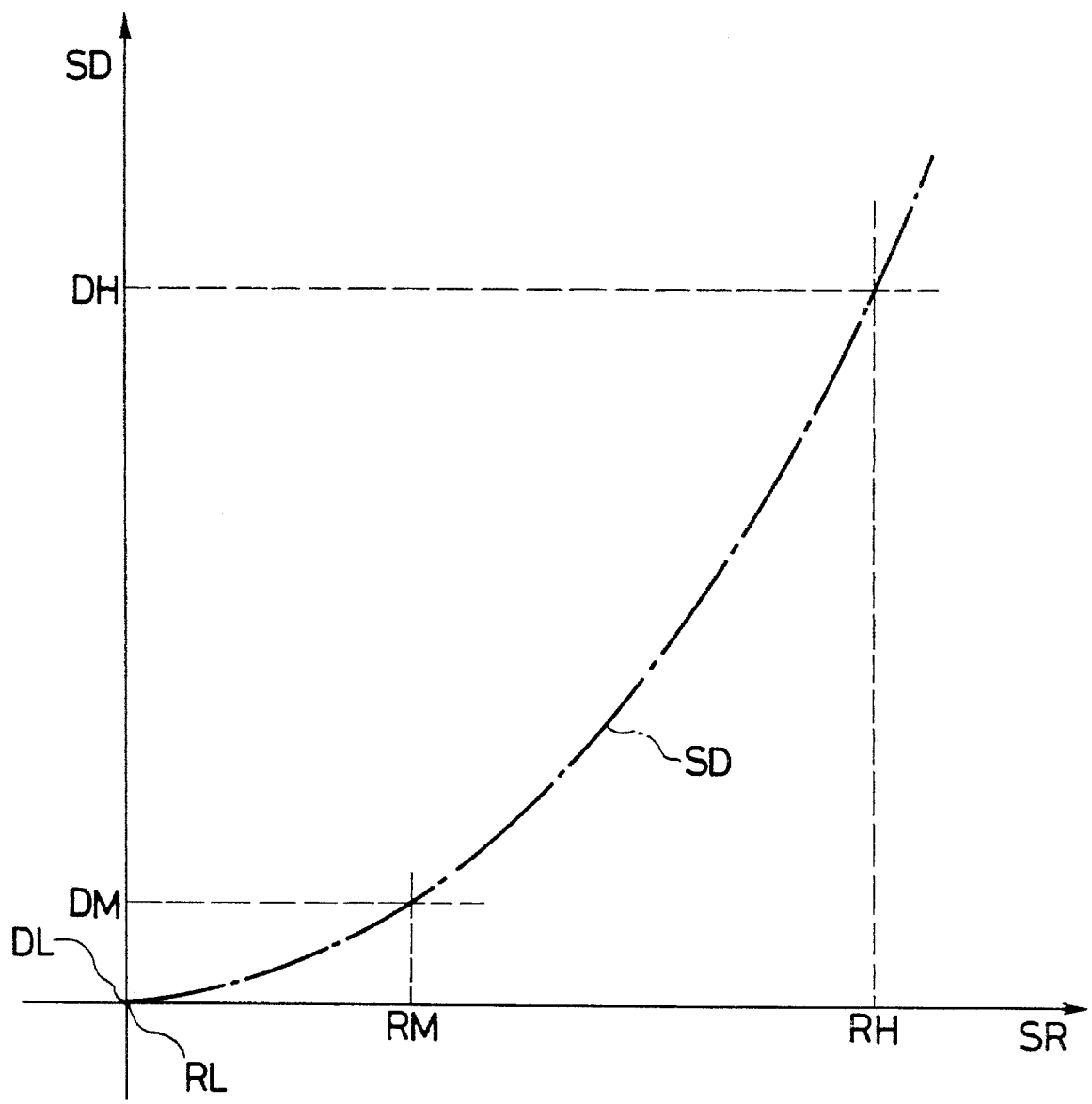
FIG. 2 is a graph illustrating the characteristic of the conventional detection circuit of FIG. 1.
Figure 3:
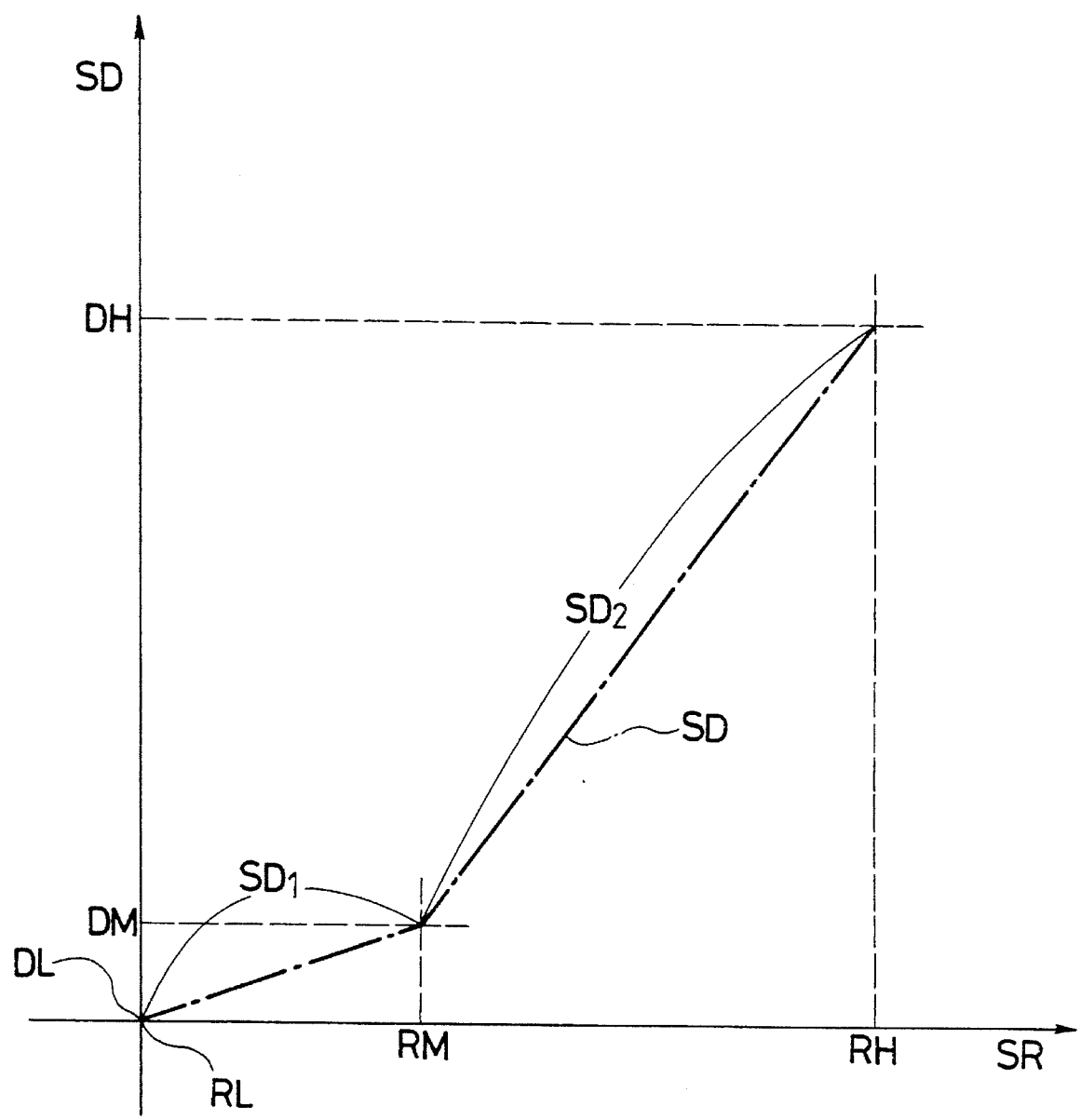
FIG. 3 is a graph showing a simplified form of the graph of FIG. 2.
Figure 5:
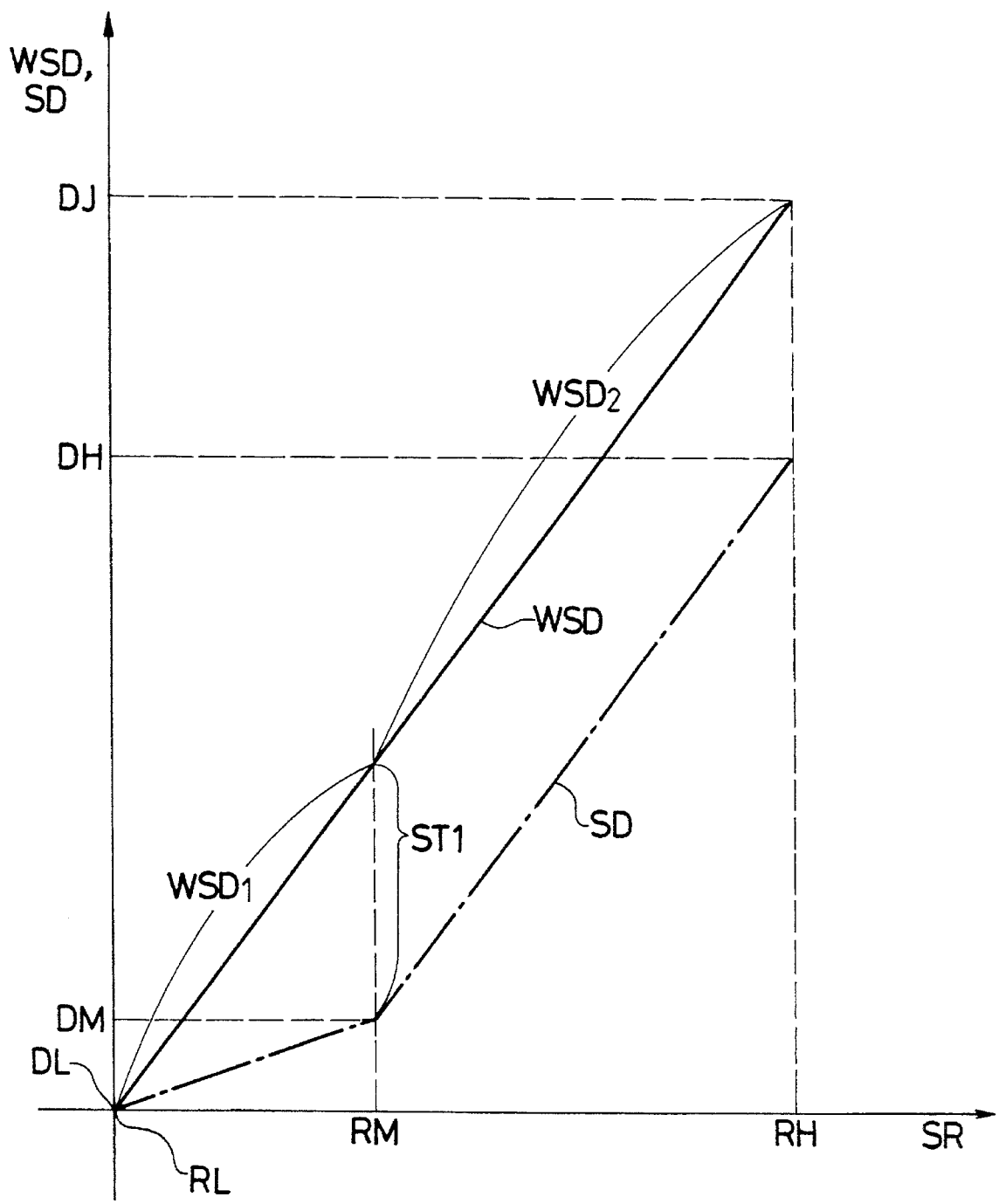
FIG. 5 is a graph illustrating operation of a concrete example of first and second level control circuits of the embodiment of FIG. 4.

In order to cause output SD to vary linearly over the overall range (RL to RH) of the level of output SR in FIG. 3, such a countermeasure as seen for example in FIG. 5 may be employed. In particular, the inclination of the linear line on the low-level side within the range (LR to RM) within which the level of output SR is equal to or lower than boundary level RM is made equal to the inclination of the linear line on the high-level side within the range (RM to RH) within which the level of output SR is higher than boundary level RM. This is performed by raising the amplification factor or gain of first level control circuit 4. Further, the linear line on the high-level side of coupler output SR is displaced upwardly by offset ST1 to ensure continuity with the variation on the low-level side. This allows desired weighting and allows realization of the desired condition indicated by solid line WSD in FIG. 5 (line WSD is composed of lines $WSD_1$ and $WSD_2$). Accordingly, output WSD of level control circuits 4, 6 exhibits a linear variation from level DL to level DJ in accordance with the variation of coupler output SR, which increases in proportion to transmission output SQ. It is preferable that boundary level RM is selected as the value of output SR at which the characteristic curve of FIG. 2 begins to incline steeply.

Figure 6:
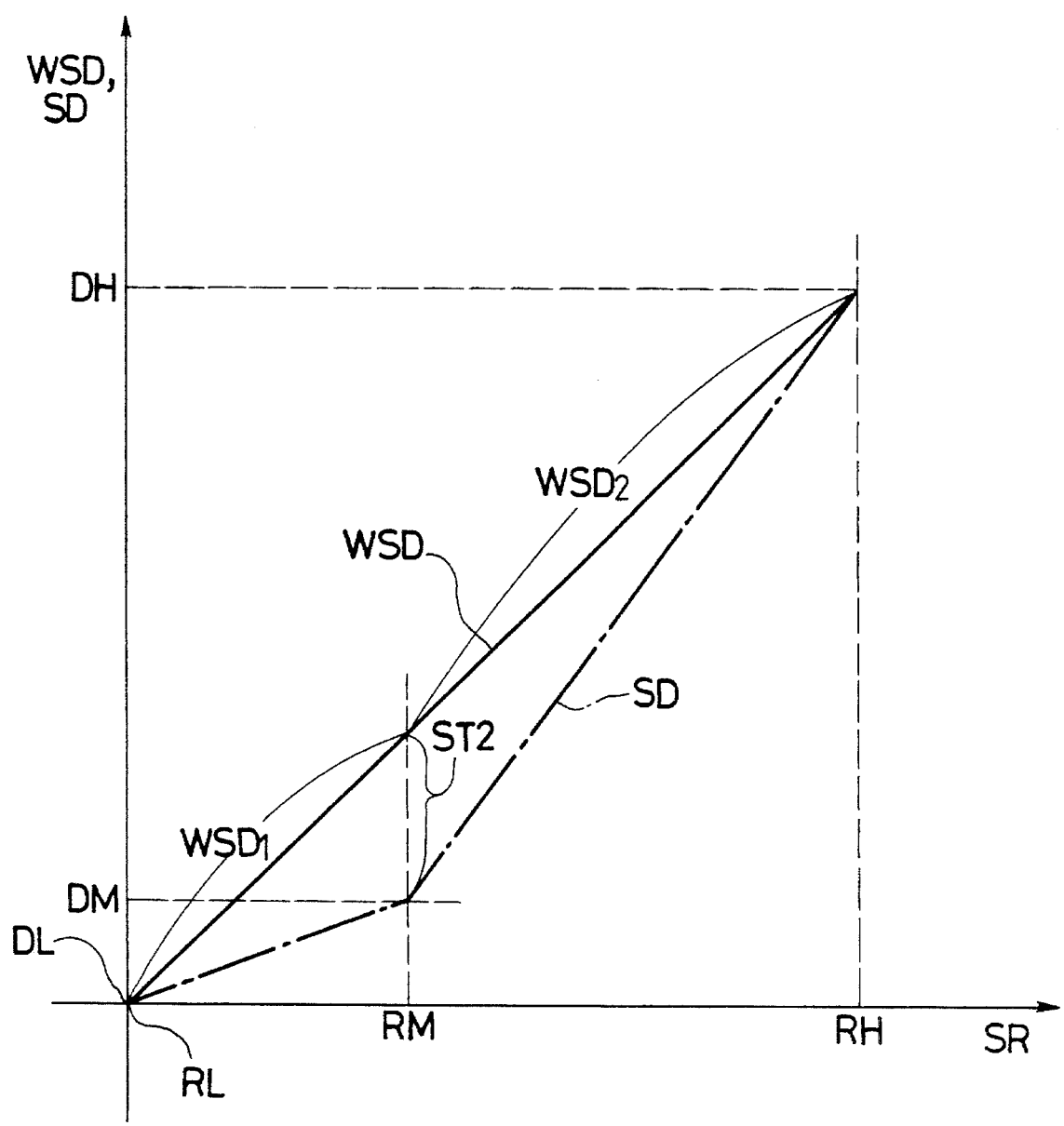
FIG. 6 is a graph illustrating operation of another example of the first and second level control circuits of the embodiment of FIG. 4.

Another weighting method different from that illustrated in FIG. 5 is illustrated in FIG. 6. Here, the inclination of the linear line on the low-level side of output SR is made equal to the inclination indicated by the solid line ($WSD_1$) by raising the amplification factor of first level control circuit 4. Further, the inclination of the linear line on the high-level side of output SR is made equal to the inclination indicated by the solid line ($WSD_2$) by decreasing the amplification factor of second level control circuit 6, and the line is further displaced upwardly by offset ST2. This allows realization of the desired condition indicated by the solid line whereby output WSD of level control circuits 4, 6 varies linearly from level DL to level DH.

Since the output voltages of the detection circuits which correspond to a higher portion and a lower portion of the dynamic range of the level of output signal SQ are separately weighted by first and second level control circuits 4, 6, respectively, to control the output level by way of the separate closed loops as described above, the present invention has an advantage in that, even where the output level is varied over a wide range, the influence of the non-linearity of detection circuit 3 which arises at the upper and lower limits of the output level range can be eliminated and the setting accuracy at each output level can be realized stably and with a high degree of accuracy.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An output level control circuit for a transmitter which receives an input signal and a level setting signal which indicates a desired transmission output level, amplifies the input signal to a transmission output level indicated by the level setting signal and outputs a transmission output signal having the transmission output level, comprising:

an amplifier for amplifying the input signal while varying the output level of the output signal in response to a level control voltage;

a coupler for extracting a coupler output from the output signal of said amplifier in accordance with a fixed coupling amount;

a detection circuit for detecting the coupler output and outputting a detection output;

a first level control circuit for weighting a level of the detection output of said detection circuit so that, when the detection output corresponds to a low-level side which is at or below a predetermined boundary level, the detection output may keep a linearity wherein the detection output increases in proportion to a variation of the level of the output signal of said amplifier;

a second level control circuit for weighting the level of the detection output of said detection circuit so that, when the detection output corresponds to a high-level side which is higher than the boundary level, the detection output may keep a linearity wherein the detection output increases in proportion to a variation of the level of the output signal of said amplifier;

a first comparison circuit for comparing an output level of said first level control circuit with a first reference level to generate a first error signal;

a second comparison circuit for comparing an output level of said second level control circuit with a second reference level to generate a second error signal;

a selection circuit for selectively outputting the first error signal of said first comparison circuit or the second error signal of said second comparison circuit in accordance with a selection signal;

a control signal generation circuit for supplying the first and second reference levels to said first and second comparison circuits, respectively, so that the transmission output level may coincide with an indication of the level setting signal, outputting the selection signal indicating that the first error signal of said first comparison circuit should be selected when the transmission output level indicated by the level setting signal corresponds to the low-level side with respect to the boundary level, but outputting the selection signal indicating that the second error signal of said second comparison circuit should be selected when the transmission output level corresponds to the high-level side with respect to the boundary level, and supplying the thus-outputted selection signal to said selection circuit; and an amplifier control circuit for supplying said amplifier with the level control voltage in response to the first or second error signal selected by said selection circuit.

2. An output level control circuit as claimed in claim 1, wherein in carrying out weighting, an amplification factor of said first level control circuit is increased so as to approximate an amplification factor of said second level control circuit, and the output of said second level control circuit is provided with an offset so that a variation of the output of said second level control circuit has continuity with a variation of the output of said first level control circuit.

3. An output level control circuit as claimed in claim 1, wherein in carrying out weighting, an amplification factor of said first level control circuit is increased so as to approximate a desired amplification factor while an amplification factor of said second level control circuit is decreased so as to approximate the desired amplification factor, and the output of said second level control circuit is provided with an offset so that a variation of the output of said second level control circuit has continuity with a variation of the output of said first level control circuit.

4. An output level control circuit as claimed in claim 1, wherein said control signal generation circuit outputs the first reference level to said first comparison circuit when the transmission output level indicated by the level setting signal corresponds to the low-level side with respect to the boundary level, but outputs the second reference level to said second comparison circuit when the transmission output level indicated by the level setting signal corresponds to the high-level side with respect to the boundary level.

5. An output level control circuit as claimed in claim 1, wherein the first and second reference levels have an equal level corresponding to the indication of the level setting signal and are outputted simultaneously to said first and second comparison circuits.

* * * * *